United States Patent
Van Bazooijen

(10) Patent No.: US 8,890,636 B2
(45) Date of Patent: *Nov. 18, 2014

(54) DEVICE COMPRISING A CONTROLLED MATCHING STAGE

(71) Applicant: Qualcomm Technologies, Inc., San Diego, CA (US)

(72) Inventor: Adrianus Van Bazooijen, Molenhoek (NL)

(73) Assignee: Qualcomm Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/912,038

(22) Filed: Jun. 6, 2013

(65) Prior Publication Data

US 2013/0271234 A1    Oct. 17, 2013

Related U.S. Application Data

(63) Continuation of application No. 13/351,064, filed on Jan. 16, 2012, now Pat. No. 8,476,986, which is a continuation of application No. 11/719,535, filed on May 7, 2009, now Pat. No. 8,111,111, which is a continuation of application No. PCT/IB2005/053777, filed on Nov. 16, 2005.

(30) Foreign Application Priority Data

Nov. 19, 2004  (EP) .................................. 04105943.7

(51) Int. Cl.
*H03H 7/38* (2006.01)
*H04B 1/18* (2006.01)
*H04B 1/04* (2006.01)

(52) U.S. Cl.
CPC . *H03H 7/38* (2013.01); *H04B 1/18* (2013.01); *H04B 1/0458* (2013.01)
USPC ........................................................ 333/17.3

(58) Field of Classification Search
USPC .................................................. 333/17.3, 32
See application file for complete search history.

(56) References Cited

U.S. PATENT DOCUMENTS 5,398,261 A    3/1995  Marbot
5,483,680 A    1/1996  Talbot
(Continued)

FOREIGN PATENT DOCUMENTS

JP    S59108346 U    7/1984
JP    S6122755 A    1/1986
(Continued)

OTHER PUBLICATIONS

European Search Report—EP13155282—Search Authority—Munich—Apr. 23, 2013.
(Continued)

*Primary Examiner* — Stephen Jones
(74) *Attorney, Agent, or Firm* — Smith Risley Tempel Santos LLC

(57) ABSTRACT

A device includes a matching stage coupled between a first signal terminal and a second signal terminal. A signal path extends between the first signal terminal and the second terminal. An adjustable impedance element is connected to the signal path. A detection circuit is coupled to the signal path and configured to derive matching information. A control circuit is coupled between the detection circuit and the adjustable impedance element. The control circuit is configured to control the adjustable impedance element.

33 Claims, 3 Drawing Sheets

(56) References Cited

U.S. PATENT DOCUMENTS

| | | | |
|---|---|---|---|
| 5,742,201 A | 4/1998 | Eisenberg et al. | |
| 6,281,748 B1 | 8/2001 | Klomsdorf et al. | |
| 6,845,126 B2 | 1/2005 | Dent et al. | |
| 6,961,368 B2 | 11/2005 | Dent et al. | |
| 8,111,111 B2 | 2/2012 | Van Bezooijen | |
| 8,476,986 B2 | 7/2013 | Van Bezooijen | |
| 2002/0101907 A1* | 8/2002 | Dent et al. | 375/132 |
| 2003/0193997 A1 | 10/2003 | Dent et al. | |

FOREIGN PATENT DOCUMENTS

| | | |
|---|---|---|
| JP | H01188201 A | 7/1989 |
| JP | H0356064 A | 3/1991 |
| JP | 05021526 A | 1/1993 |
| JP | H05199070 A | 8/1993 |
| JP | H07297730 A | 11/1995 |
| JP | H08154060 A | 6/1996 |
| JP | H08213920 A | 8/1996 |
| JP | H10341117 A | 12/1998 |
| JP | H1188201 A | 3/1999 |
| JP | 2000507751 A | 6/2000 |
| JP | 2001016044 A | 1/2001 |
| JP | 2001257617 A | 9/2001 |
| JP | 2001274651 A | 10/2001 |
| JP | 2004519150 A | 6/2004 |
| WO | 8703378 A1 | 6/1987 |
| WO | 9728598 A1 | 8/1997 |
| WO | 02063782 A2 | 8/2002 |

OTHER PUBLICATIONS

International Search Report—PCT/IB2005/053777—ISA/EPO—Mar. 1, 2006.

Zolomy A., et al., "Automatic Antenna Tuning for RF Transmitter IC Applying High Q Antenna," IEEE Radio Frequency Integrated CircuitsSymposium, Digest of Papers, Jun. 6-8, 2004, pp. 501-504, IEEE.

\* cited by examiner

DEVICE COMPRISING A CONTROLLED MATCHING STAGE

This application is a continuation of U.S. patent application Ser. No. 13/351,064 filed on Jan. 16, 2012, which is a continuation of U.S. patent application Ser. No. 11/719,535, filed May 7, 2009 (issued as U.S. Pat. No. 8,111,111), which is a continuation of co-pending International Application No. PCT/IB2005/053777, filed Nov. 16, 2005, which published as WO/2006/054246, and which claims priority to European Application No. 04105943.7 filed Nov. 19, 2004. All of these applications are incorporated herein by reference.

TECHNICAL FIELD

The invention relates to a device comprising a controlled matching stage for matching a second stage to a first stage, and further relates to a controlled matching stage for matching a second stage to a first stage, to a method for matching a second stage to a first stage, and to a processor program product for matching a second stage to a first stage.

Examples of such a device are mobile phones, wireless interfaces, and further transmitters and/or receivers.

BACKGROUND

A prior art device is known from WO 02/063782 A2, which discloses in its FIG. 10 controlled matching stage. This controlled matching stage uses a directional coupler for sampling a forward power signal and a reflected power signal and converts the power signals into control signals. These control signals are supplied to a processing unit, which controls a capacitor bank.

The known device is disadvantageous, inter alia, owing to the fact that it is relatively complex. The power signals need to be converted into control signals. These control signals need to be processed in the processing unit, before it can control the capacitor bank.

SUMMARY

It is an object of the invention, inter alia, to provide a device which is relatively simple.

Furthers objects of the invention are, inter alia, to provide a controlled matching stage, a method and a processor program product which are relatively simple.

The device according to the invention comprises a controlled matching stage for matching a second stage to a first stage. The controlled matching stage comprises deriving means for deriving a first signal and a second signal from an output signal of the first stage; detecting means for detecting a phase between the first signal and the second signal; and controlling means for controlling an adjustable impedance network in response to said detecting for said matching.

By introducing the detecting means for detecting a phase between the first signal and the second signal, it is no longer necessary to use a forward power signal and a reflected power signal. In response to said detecting, the controlling means directly control the adjustable impedance network. As a result, the device according to the invention is relatively simple.

The device according to the invention is further advantageous in that the controlled (and/or adaptive) matching stage will improve the linearity and the efficiency of the first stage and/or the second stage, will relax reliability requirements which can be traded off against further size and/or cost reductions, and will improve the user friendliness of the device when it gets less hot than before.

A controlled matching stage is a matching stage that is (automatically) controlled, for example via a loop such as an open loop (forward control) or a closed loop (backward control).

It should be noted that the article "Automatic Antenna Tuning for RF Transmitter IC Applying High Q Antenna," by Attila Zolomy, Ferenc Mernyei, János Erdélyi, Matthijs Pardoen+ and Gábor Tóth, Integration Hungary Ltd., Záhony u. 7. 1031 Budapest, Hungary, +Integration Associates Inc., 110 Pioneer Way, Unit L, Mountain View, Calif. 94041 USA, 0-7803-8333-8/04/$20.00 (C) 2004 IEEE discloses in FIG. 3 an antenna tuning circuitry comprising deriving means for deriving a first signal from an output signal of a power amplifier (the first stage being a power amplifier stage) and for deriving a second signal from a control signal of the power amplifier. So, the second signal is not derived from the output signal of the power amplifier stage but comes from somewhere inside the power amplifier stage. This is a disadvantageous solution. The article does not show the advantageous deriving means for deriving a first signal and a second signal from an output signal of the first stage.

An embodiment of the device according to the invention is defined by the second stage comprising an antenna stage and the first stage comprising a power amplifier stage or a switching stage. In this case, the controlled matching stage is located between a power amplifier stage or a switching stage on the one hand and an antenna stage on the other hand. The power amplifier stage for example comprises a power amplifier and the antenna stage for example comprises an antenna and/or an antenna connection.

An embodiment of the device according to the invention is defined by the first stage comprising a power amplifier stage and the second stage comprising a switching stage or an antenna stage. In this case, the controlled matching stage is located between a power amplifier stage on the one hand and an antenna stage or a switching stage on the other hand.

An embodiment of the device according to the invention is defined by the deriving means comprising an element, the first signal being the output signal and the second signal being derived via the element. Such an element might for example comprise (a resistance of) a diode or a switch, with the output signal being an output voltage and with the first signal being this output voltage and with the second signal being a voltage across the element. So, parts of the deriving means might coincide with other parts of the same controlled matching stage or with parts of a following stage.

An embodiment of the device according to the invention is defined by the element comprising a passive element and the adjustable impedance network comprising an adjustable capacitor. Such a passive element can be a resistor, in which case one of the signals will need to be phase shifted and a phase shifter is to be introduced into the controlled matching stage. Such a passive element can also be an inductor, in which case the inductor may be shifted from the adjustable impedance network into the deriving means. With the output signal being an output voltage and with the first signal being this output voltage and with the second signal being a voltage across the inductor, it is no longer necessary to introduce the phase shifter into the controlled matching stage. This is because the voltage across and the current through the inductor are already shifted in phase. The adjustable impedance network comprises an adjustable capacitor that for example corresponds with a capacitor bank, and may further comprise the inductor. Such a passive element can also be a capacitor etc.

An embodiment of the device according to the invention is defined by the detecting means comprising a phase detector. Such a phase detector is an advantageous (low cost and simple) embodiment.

An embodiment of the device according to the invention is defined by the phase detector comprising first and second limiters for limiting the first and second signals and comprising a mixer for mixing the limited first and second signals. Such first and second limiters and such a mixer are an advantageous (low cost and simple) embodiment.

An embodiment of the device according to the invention is defined by the controlling means comprising an analog-to-digital converter and a digital circuit. Such a digital circuit is an advantageous (low cost and simple) embodiment, and therefore the analog-to-digital converter is to be located directly after the detecting means, to make an analog part as small as possible and to make a digital part as large as possible.

An embodiment of the device according to the invention is defined by the digital circuit comprising an up-down counter, the up-down counter comprising a counting input coupled to the analog-to-digital converter and an enabling input to be coupled to a base band controller. Such an up-down counter is an advantageous (low cost and simple) embodiment. An output of the up-down counter is for example via a dc-dc level shifter coupled to a control input of the adjustable impedance network. The base band controller for example supplies a pulse to the enabling input in dependence of, for example, a mode of the device (for example a TDMA frame), such as a transmitter mode. A rising edge of the pulse for example defines the loading of the up-down counter via the counting input (positive or negative value) and a falling edge of the pulse for example defines the up-counting (in case of a loaded positive value) or the down-counting (in case of a loaded negative value) dependently on the loading.

Embodiments of the controlled matching stage according to the invention and of the method according to the invention and of the processor program product according to the invention correspond with the embodiments of the device according to the invention.

The invention is based upon an insight, inter alia, that a use of forward power signals and reflected power signals make the device unnecessary complex (and large in order to create directivity in the bidirectional coupler), and is based upon a basic idea, inter alia, that a first signal and a second signal are to be derived from an output signal of a first stage, a phase between the first signal and the second signal is to be detected, and an adjustable impedance network is to be controlled in response to said detecting for said matching.

The invention solves the problem, inter alia, to provide a device which is relatively simple, and is advantageous, inter alia, in that the controlled matching stage will improve the linearity and the efficiency of the first stage and/or the second stage, will relax reliability requirements which can be traded off against further size and cost reductions, and will improve the user friendliness of the device when it gets less hot than before.

These and other aspects of the invention will be apparent from and elucidated with reference to the embodiments described hereinafter.

BRIEF DESCRIPTION OF THE DRAWINGS

The described embodiments are described in more detail by means of the following embodiment examples. Here.

DETAILED DESCRIPTION OF ILLUSTRATIVE EMBODIMENTS

Figure 1:
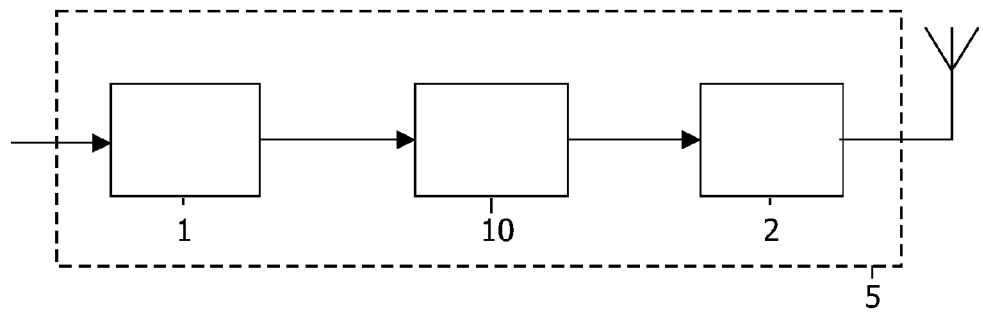
FIG. 1 shows diagrammatically a device according to the invention comprising a power amplifier stage, a controlled matching stage according to the invention and an antenna stage.

The device 5 according to the invention shown in FIG. 1 comprises a power amplifier stage 1, a controlled matching stage 10 according to the invention and an antenna stage 2. An output of the power amplifier stage 1 is coupled to an input of the controlled matching stage 10, and an output of controlled matching stage 10 is coupled to an input of the antenna stage 2. The power amplifier stage 1 for example comprises a power transistor, and the antenna stage 2 for example comprises an antenna and/or an antenna connection.

Figure 2:
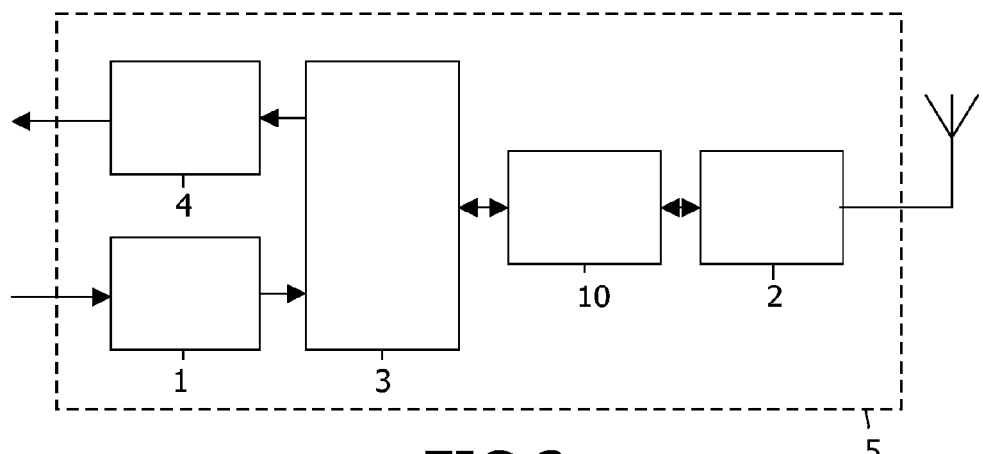
FIG. 2 shows diagrammatically a device according to the invention comprising a power amplifier stage, a receiver stage, a controlled matching stage according to the invention and an antenna stage, with a switching stage located between the power amplifier stage and the receiver stage on the one hand and the controlled matching stage on the other hand.

The device 5 according to the invention shown in FIG. 2 comprises a power amplifier stage 1, a receiver stage 4, a switching stage 3, a controlled matching stage 10 according to the invention and an antenna stage 2. An output of the power amplifier stage 1 is coupled to an input of the switching stage 3, an input of the receiver stage 4 is coupled to an output of the switching stage 3, and an in/output of the switching stage 3 is coupled to an in/output of the controlled matching stage 10. A further in/output of the controlled matching stage 10 is coupled to an in/output of the antenna stage 2. In a transmitter mode, the controlled matching stage 10 is active, in a receiver mode, the controlled matching stage 10 is inactive, for example by being short-circuited (not shown) or by disconnecting it (not shown). An option of having (further) stages in parallel is not to be excluded.

Figure 3:
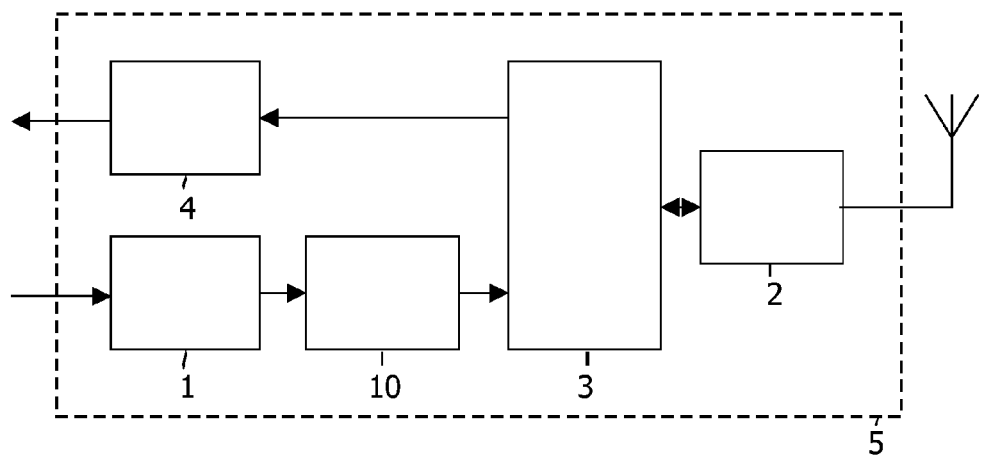
FIG. 3 shows diagrammatically a device according to the invention comprising a power amplifier stage, a receiver stage, a controlled matching stage according to the invention and an antenna stage, with a switching stage located between the power amplifier stage, the controlled matching stage and the receiver stage on the one hand and the antenna stage on the other hand.

The device 5 according to the invention shown in FIG. 3 comprises a power amplifier stage 1, a receiver stage 4, a controlled matching stage 10 according to the invention, a switching stage 3, and an antenna stage 2. An output of the power amplifier stage 1 is coupled to an input of the controlled matching stage 10, an output of the controlled matching stage 10 is coupled to an input of the switching stage 3, an input of the receiver stage 4 is coupled to an output of the switching stage 3, and an in/output of the switching stage 3 is coupled to an in/output of the antenna stage 2.

Figure 4:
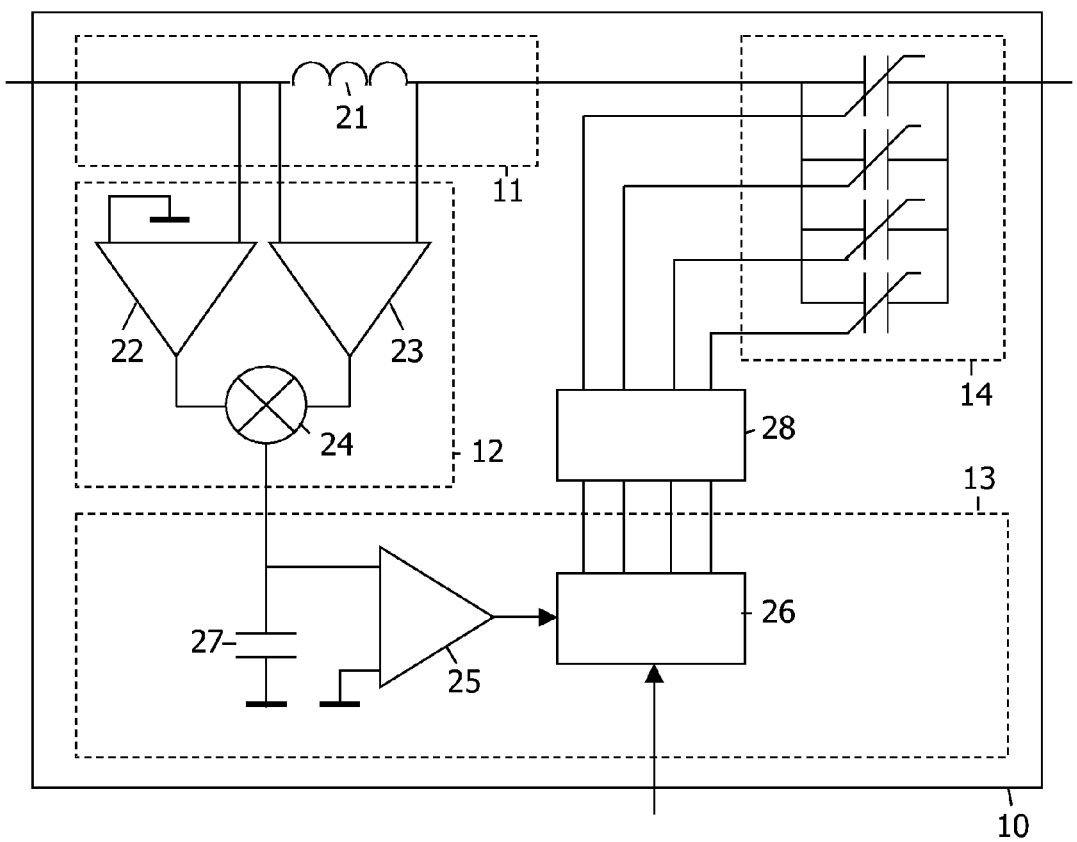
FIG. 4 shows diagrammatically a controlled matching stage according to the invention in greater detail for use in a device according to the invention.

The controlled matching stage 10 according to the invention shown in FIG. 4 comprises deriving means 11 for deriving a first signal and a second signal from an output signal of a first stage 1,3, detecting means 12 for detecting a phase between the first signal and the second signal, and controlling means 13 for controlling an adjustable impedance network 14 in response to said detecting for said matching. The deriving means 11 comprise an element 21 such as for example an inductor or, alternatively, a (variable) capacitor, with the first signal being the output signal (the voltage at the output of the first stage 1,3 with respect to ground) and the second signal being derived via the element 21 (the voltage across 20 the inductor). The adjustable impedance network 14 comprises an adjustable capacitor, such as for example four adjustable capacitors in parallel (a binary weighted 4-bit switched capacitor array).

The detecting means 12 comprising a phase detector 22-24. This phase detector 22-24 comprises first and second limiters 22, 23 for limiting the first and second signals and comprises a mixer 24 for mixing the limited first and second signals and a capacitor 27 coupled to ground to remove unwanted RF frequency components. The controlling means 13 comprise an analog-to-digital converter 25 such as for example a third limiter of which an input is coupled to an output of the mixer 24. The controlling means 13 further comprise a digital circuit 26 such as for example an up-down counter comprising a counting input coupled to an output of the analog-to-digital converter 25 and comprising an enabling input to be coupled to an output of a base band controller (not shown). Outputs of the digital circuit 26 are coupled via a dc-dc level shifter 28 to control inputs of the adjustable impedance network 14 for controlling its four adjustable (switchable) capacitors. The base band controller (not shown) for example supplies a pulse to the enabling input in dependence of for example a mode of the device 5, such as a transmitter mode. A rising edge of the pulse for example defines the loading of the up-down counter via the counting input (positive or negative value) and a falling edge of the pulse for example defines the up-counting (in case of a loaded positive value) or the down-counting (in case of a loaded negative value) dependently on the loading.

Between the first stage 1 (or 3 or 1 respectively) and the second stage 2 (or 2 or 3 respectively), the controlled matching stage 10 introduces a so-called series LC network. Of this series LC network, the inductor L has a fixed value and the capacitor C has an adjustable value. The use of this series LC network is very advantageous, as explained hereafter.

Nowadays, a device 5 in the form of a cellular phone usually makes use of a built-in antenna that is constructed as a planar inverted-F antenna (PiFa). A dual-band planar inverted-F antenna is designed to be series resonant at both bands of operation. Body-effects detune the antenna resonance frequencies downwards causing an inductive behavior of the antenna at both bands. This fluctuation in the reactive part of the antenna impedance is typically much larger than the change in the resistive part of the antenna impedance that represents its radiation resistance. The limited antenna bandwidth results mainly in a capacitive behavior of the antenna feed impedance at the lower end of the band and in an inductive behavior at the higher end. The body-effects and limited antenna bandwidth cause mainly a change in the reactance of the antenna feed impedance. Therefore, a variable series LC network, located close to this feed point, can effectively be used to compensate for a major part of antenna impedance variations that occur in practice. This series LC network is embedded in a control loop comprising the deriving means 11, the detecting means 12 and the controlling means 13 to automatically correct the mismatches.

The control loop controls the detected phase of the matched impedance $\phi_{Zdet}$ to zero. This phase is given by the phase difference between the series LC network input voltage u and its input current i. It is detected by a (Gilbert cell) mixer 24 which input signals are hard limited by the limiters 22, 23. The phase of the input current i is derived from the voltage across the series inductor L that acts as, an almost frequency independent, +90 degrees phase shifter. The phase detector output signal $\phi_{Zdet}$ is fed to the analog-to-digital converter 25 in the form of a limiter to determine the sign of the phase error. Depending on this sign of the phase error the up-down counter will either increase or decrease its output value in steps of one least significant bit under control of a base band enable signal. In a Time Division Multiple Access based system, reading of the phase error can occur at the rising edge of the base band enable signal while a power burst is being transmitted, whereas an update of the capacitor value can be done outside the power burst at the falling edge of the base band enable signal. This avoids spurious emission and hot-switching during adaptation.

The controlled matching stage 10 is made variable with for example a 4-bit binary weighted switched capacitor array. Its capacitance can be changed in steps of 0.25 pF to a maximum of 8 pF. A possible implementation of the switched capacitor array might use RF-MEMS devices that need high actuation voltages. Therefore, a level shifter between the up-down counter output and the switched capacitor control lines might need to be used.

Figure 5:
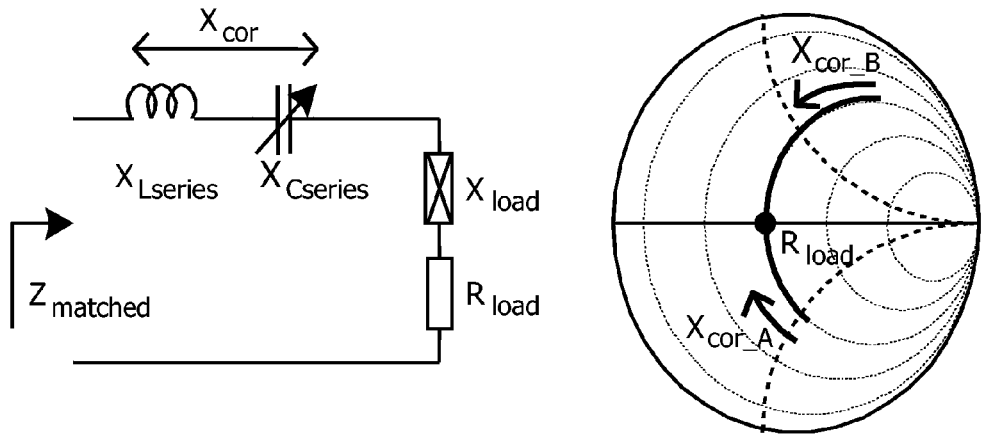
FIG. 5 shows a series LC network design and a corresponding Smith chart for use in a controlled matching stage according to the invention.

A series LC network design and a corresponding Smith chart for use in a controlled matching stage 10 according to the invention are shown in FIG. 5. The series LC network comprises, to get a Z-matched, a serial circuit of X-L-series, X-C-series, X-load and R-load. The X-L-series and the X-C-series together form X-cor.

Figure 6:
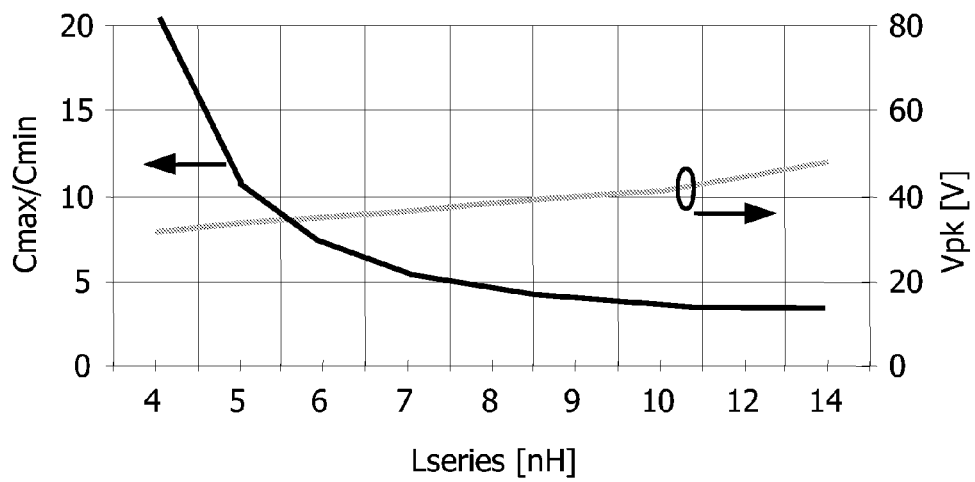
FIG. 6 shows a maximum-to-minimum capacitor ratio Cmax/Cmin ratio and a maximum peak voltage Vpk across the capacitor as a function of an inductor value L of the 20 series LC network design shown in FIG. 5.

A maximum-to-minimum capacitor ratio Cmax/Cmin ratio and a maximum peak voltage Vpk across the capacitor as a function of an inductor value L of the series LC network design shown in FIG. 5 are shown in FIG. 6.

These FIGS. 5 and 6 are to be looked at as follows. A variable series LC network allows for correction of both capacitive and inductive mismatches. This correction of the load reactance X-cor is visualized in the Smith chart of FIG. 5 as a rotation over the bold circle segment of constant resistance R-load. X-cor is positive (inductive) when the load is capacitive and is negative (capacitive) when the load is inductive. The maximum-to-minimum capacitance ratio depends on the series inductor reactance X-L-series and on the amount of correction that is desired on both sides of the circle segment of constant resistance R-load. In FIG. 6 a curve of Cmax/Cmin versus L-series is shown as an example in which the magnitude of the reflection coefficient |Γ| is reduced from approx. 0.6 to 0.3 for a capacitive mismatch and from approx. 0.7 to 0.3 for an inductive mismatch. Especially for small values of L-series the ratio becomes very large. In a series LC network relatively high voltages Vpk across the variable capacitor occur at high power and large mismatch conditions. Typical values of this peak voltage Vpk are given on the right-hand-side Y-axis in FIG. 6. These are valid for 2 Watt delivered into a 50Ω load resistance at 900 MHz. At these high RF-voltages self-actuation of the electrostatic RF-MEMS devices shall be avoided and harmonic distortion shall be kept below −70 dBc in order to be able to meet typical GSM system specification.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. A device comprising a matching stage coupled between a first signal terminal and a second signal terminal, the matching stage comprising:
    a signal path between the first signal terminal and the second terminal;
    an adjustable impedance element connected to the signal path;
    a detection circuit coupled to the signal path and configured to derive matching information; and
    a control circuit coupled between the detection circuit and the adjustable impedance element, the control circuit including an analog-to-digital converter and a counter circuit, the analog-to-digital converter configured to convert an analog signal produced by the detection circuit to a digital signal, the counter circuit configured to adjust a count in response to the digital signal, the control circuit configured to adjust the adjustable impedance element in response to the count.

2. The device according to claim 1, wherein the adjustable impedance element comprises an adjustable capacitor and/or inductor.

3. The device according to claim 1, wherein the adjustable impedance element is an element of an impedance matching network.

4. The device according to claim 1, wherein the detecting circuit comprises circuit elements for measuring the impedance matching within the signal path.

5. The device according to claim 1, wherein the first terminal is connected to a power amplifier, a switching stage or a duplexer and the second terminal is connected to an antenna.

6. The device according to claim 1, further comprising a base band controller configured to submit information related to a transmission mode to the control circuit, wherein the control circuit is configured to control the impedance of the adjustable impedance element during a transmission pulse of a mobile communication device.

7. The device according to claim 1, further comprising a base band controller configured to submit information related to a transmission mode to the control circuit, wherein the control circuit is configured to enable the detection circuit during transmission and to control the impedance of the adjustable impedance element either in a frequency division duplexing mode during transmission or in a time division duplexing mode outside a transmission burst of a mobile communication device.

8. The device according to claim 1, wherein the detection circuit is configured to submit phase information of an input impedance of the device to the controlling circuit.

9. The device according to claim 1, wherein the detection circuit is configured to submit information concerning forward power and reflected power to the control circuit.

10. The device according to claim 1, wherein the second terminal is connected to a planar inverted F antenna.

11. The device according to claim 1, wherein the adjustable impedance element comprises semiconductor switches.

12. The device according to claim 1, wherein the adjustable impedance element comprises an RF-MEMS device.

13. The device according to claim 1, further comprising a storage medium with an executable program stored thereon, wherein the program comprises an algorithm to adjust the impedance of the adjustable impedance element.

14. The device according to claim 13, wherein the algorithm adjusts the impedance element in small steps, each small step being represented by one least significant bit.

15. A device comprising:
    a controlled matching stage for matching a second stage to a first stage, the controlled matching stage comprising
        deriving means for deriving a first signal and a second signal from an output signal of the first stage,
        detecting means for detecting a phase between the first signal and the second signal, and
        controlling means for controlling an adjustable impedance, the controlling means including an analog-to-digital converter and a counter circuit, the analog-to-digital converter configured to convert an analog signal produced by the detecting means to a digital signal, the counter circuit configured to adjust a count in response to the digital signal, the controlling means configured to adjust the adjustable impedance in response to the count.

16. The device according to claim 15, wherein the second stage comprises an antenna stage and the first stage comprising a power amplifier stage or a switching stage.

17. The device according to claim 15, wherein the first stage comprises a power amplifier stage and the second stage comprises a switching stage or an antenna stage.

18. The device according to claim 15, wherein the counter circuit comprises an up-down counter, wherein the up-down counter comprises a counting input coupled to the analog-to-digital converter and an enabling input to be coupled to a base band controller.

19. The device according to claim 15, wherein the detecting means comprises a phase detector.

20. The device according to claim 19, wherein the phase detector comprises first and second limiters for limiting the first and second signals and comprising a mixer for mixing the limited first and second signals.

21. The device according to claim 15, wherein the deriving means comprises an element, wherein the first signal is the output signal and the second signal is derived via the element.

22. The device according to claim 21, wherein the adjustable impedance network comprises an adjustable capacitor.

23. The device according to claim 21, wherein the element comprises a passive element.

24. The device according to claim 23, wherein the passive element comprises an inductor.

25. The device according to claim 23, wherein the passive element comprises a capacitor.

26. A controlled matching stage for matching a second stage to a first stage, the controlled matching stage comprising:
    an element for deriving a first signal and a second signal from an output signal of the first stage;
    a phase detector for detecting a phase between the first signal and the second signal; and
    a controller for controlling an adjustable impedance network, the controller including an analog-to-digital converter and a counter circuit, the analog-to-digital converter configured to convert an analog signal produced by the phase detector to a digital signal, the counter circuit configured to adjust a count in response to the digital signal, the controller configured to adjust the adjustable impedance network in response to the count.

27. The controlled matching stage of claim 26, wherein the controller comprises a control circuit configured to control an adjustable impedance network in response to the detected phase for matching the second stage to the first stage.

28. The controlled matching stage of claim 26, wherein the counter circuit comprises an up-down counter, the up-down counter comprising a counting input coupled to the analog-to-digital converter and an enabling input to be coupled to a base band controller.

29. The controlled matching stage of claim 26, wherein the element comprises an inductor.

30. The controlled matching stage of claim 26, wherein the element comprises a capacitor.

31. The controlled matching stage of claim 26, wherein the second stage comprises an antenna stage and the first stage comprises a power amplifier stage.

32. The controlled matching stage of claim 26, wherein the second stage comprises an antenna stage and the first stage comprises a switching stage.

33. A non-transitory computer-readable storage medium with an executable program stored thereon, wherein the program instructs a processor to perform steps for matching a second stage to a first stage, the executable program comprising the functions of:
- deriving a first signal and a second signal from an output signal of the first stage;
- detecting a phase between the first signal and the second signal; and
- controlling an adjustable impedance network by converting an analog signal responsive to a detected phase to a digital signal, adjusting a count in response to the digital signal, and adjusting the adjustable impedance network in response to the count.

* * * * *